United States Patent
Lin

(10) Patent No.: US 12,089,508 B2
(45) Date of Patent: Sep. 10, 2024

(54) SEMICONDUCTOR DEVICE AND METHOD FOR FABRICATING THE SAME

(71) Applicant: UNITED MICROELECTRONICS CORP., Hsin-Chu (TW)

(72) Inventor: Hung-Chan Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 207 days.

(21) Appl. No.: 17/574,569

(22) Filed: Jan. 13, 2022

(65) Prior Publication Data

US 2023/0200258 A1    Jun. 22, 2023

(30) Foreign Application Priority Data

Dec. 16, 2021    (CN) .......................... 202111542882.0

(51) Int. Cl.
| | |
|---|---|
| *H10N 52/01* | (2023.01) |
| *H10B 61/00* | (2023.01) |
| *H10N 52/00* | (2023.01) |
| *H10N 52/80* | (2023.01) |

(52) U.S. Cl.
CPC ............ *H10N 52/01* (2023.02); *H10B 61/00* (2023.02); *H10N 52/00* (2023.02); *H10N 52/80* (2023.02)

(58) Field of Classification Search
CPC ........ H10N 52/01; H10N 52/80; H10N 52/00; H10N 50/01; H10N 50/80; H10N 50/10; H10N 59/00; H10B 61/00
See application file for complete search history.

(56) References Cited

U.S. PATENT DOCUMENTS

| | | | |
|---|---|---|---|
| 9,230,626 B2 | 1/2016 | Buhrman et al. | |
| 10,497,858 B1 * | 12/2019 | Ahn | H10N 50/01 |
| 2020/0075670 A1 | 3/2020 | Lin | |
| 2020/0235288 A1 | 7/2020 | Ikegawa | |
| 2020/0343299 A1 * | 10/2020 | Hsu | H10N 50/10 |
| 2021/0066579 A1 | 3/2021 | Wang | |
| 2021/0098529 A1 * | 4/2021 | Chuang | H10N 50/01 |
| 2021/0359199 A1 | 11/2021 | Lin | |
| 2021/0367143 A1 * | 11/2021 | Lee | H10N 50/01 |
| 2022/0223785 A1 * | 7/2022 | Lee | H10N 52/01 |
| 2022/0383922 A1 * | 12/2022 | Frougier | H10N 50/80 |

\* cited by examiner

*Primary Examiner* — Latanya N Crawford Eason
(74) *Attorney, Agent, or Firm* — Winston Hsu

(57) ABSTRACT

A method for fabricating semiconductor device includes the steps of first providing a substrate having a magnetic random access memory (MRAM) region and a logic region, forming a first inter-metal dielectric (IMB) layer on the substrate, forming a first metal interconnection and a second metal interconnection in the first IMD layer on the MRAM region, forming a spin orbit torque (SOT) layer on the first metal interconnection and the second metal interconnection, forming a magnetic tunneling junction (MTJ) stack on the SOT layer, forming a hard mask on the MTJ stack, using the hard mask to pattern the MTJ stack for forming the MTJ, forming the cap layer on the SOT layer and the hard mask, and patterning the cap layer and the SOT layer.

16 Claims, 5 Drawing Sheets

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly to a method for fabricating magnetoresistive random access memory (MRAM).

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a method for fabricating semiconductor device includes the steps of first providing a substrate having a magnetic random access memory (MRAM) region and a logic region, forming a first inter-metal dielectric (IMD) layer on the substrate, forming a first metal interconnection and a second metal interconnection in the first IMD layer on the MRAM region, forming a spin orbit torque (SOT) layer on the first metal interconnection and the second metal interconnection, forming a magnetic tunneling junction (MTJ) stack on the SOT layer, forming a hard mask on the MTJ stack, using the hard mask to pattern the MTJ stack for forming the MTJ, forming the cap layer on the SOT layer and the hard mask, and patterning the cap layer and the SOT layer.

According to another aspect of the present invention, a semiconductor device includes a spin orbit torque (SOT) layer on a substrate, a magnetic tunneling junction (MTJ) on the SOT layer, a hard mask on the MTJ, and a cap layer on the SOT layer and the MTJ.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
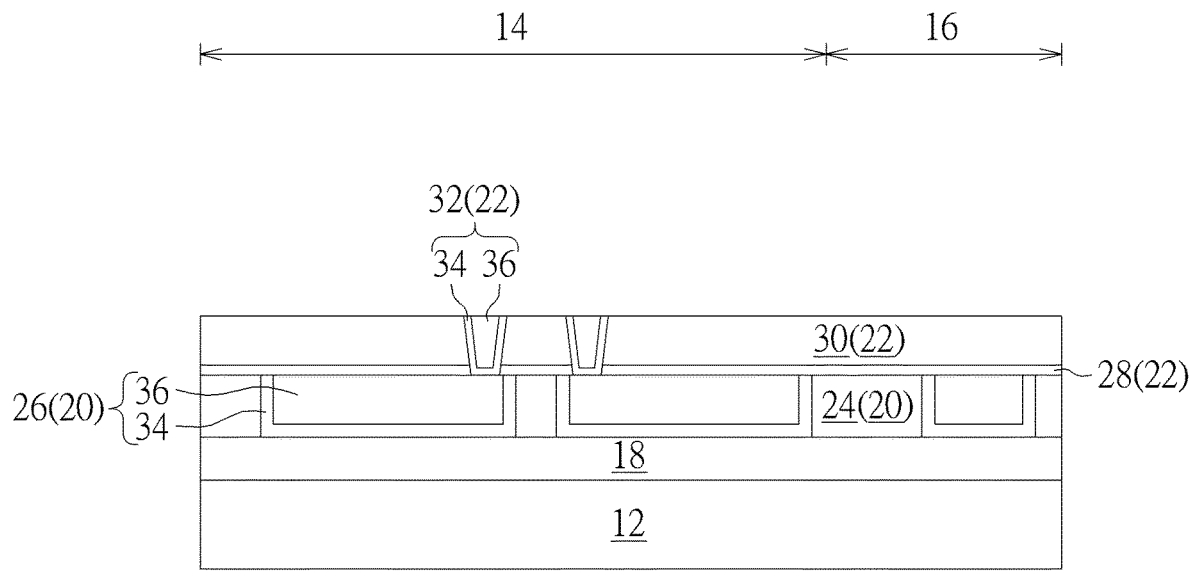
FIGS. 1-10 illustrate a method for fabricating a MRAM device according to an embodiment of the present invention.

Referring to FIGS. 1-10, FIGS. 1-10 illustrate a method for fabricating a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MRAM region 14 and a logic region 16 are defined on the substrate 12.

Active devices such as metal-oxide semiconductor (MOS) transistors, passive devices, conductive layers, and interlayer dielectric (ILD) layer 18 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 18 could be formed on the substrate 12 to cover the MOS transistors, and a plurality of contact plugs could be formed in the ILD layer 18 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 20, 22 are sequentially formed on the ILD layer 18 on the MRAM region 14 and the logic region 16 to electrically connect the aforementioned contact plugs, in which the metal interconnect structure 20 includes an inter-metal dielectric (IMD) layer 24 and metal interconnections 26 embedded in the IMD layer 24, and the metal interconnect structure 22 includes a stop layer 28, an IMD layer 30, and at least two metal interconnections 32 embedded in the stop layer 28 and the IMD layer 30 on the MRAM region 14.

In this embodiment, each of the metal interconnections 26 from the metal interconnect structure 20 preferably includes a trench conductor and the metal interconnection 32 from the metal interconnect structure 22 on the MRAM region 14 includes a via conductor. Preferably, each of the metal interconnections 26, 32 from the metal interconnect structures 20, 22 could be embedded within the IMD layers 24, 30 and/or stop layer 28 according to a single damascene process or dual damascene process. For instance, each of the metal interconnections 26, 32 could further include a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 36 in the metal interconnections 26 are preferably made of copper, the metal layer 36 in the metal interconnections 32 is made of tungsten, the IMD layers 24, 30 are preferably made of silicon oxide such as tetraethyl orthosilicate (TEOS), and the stop layer 28 is preferably made of nitrogen doped carbide (NDC), silicon nitride, silicon carbon nitride (SiCN), or combination thereof.

Figure 2:
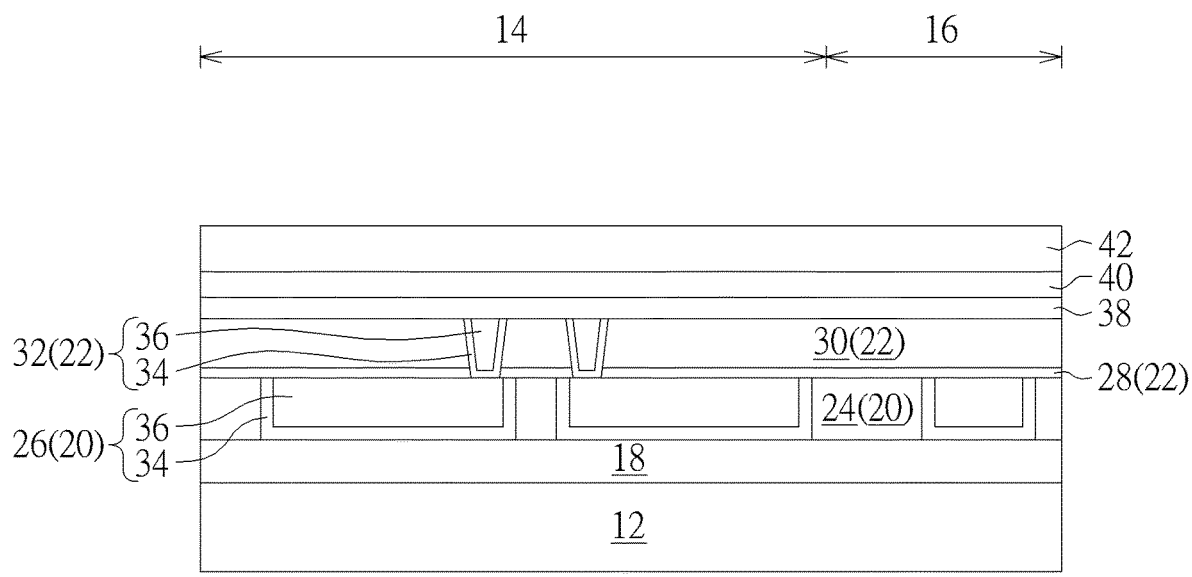

Next, as shown in FIG. 2, a spin orbit torque (SOT) layer 38, a MTJ stack 40 or stack structure, and a hard mask 42 are formed on the metal interconnect structure 22. In this embodiment, the formation of the MTJ stack 40 could be accomplished by sequentially depositing a pinned layer, a barrier layer, and a free layer on the SOT layer 38. Preferably, the pinned layer could be made of ferromagnetic material including but not limited to for example iron, cobalt, nickel, or alloys thereof such as cobalt-iron-boron (CoFeB) or cobalt-iron (CoFe). Alternatively, the pinned layer could also be made of antiferromagnetic (AFM) material including but not limited to for example ferromanganese (FeMn), platinum manganese (PtMn), iridium manganese (IrMn), nickel oxide (NiO), or combination thereof, in which the pinned layer is formed to fix or limit the direction of magnetic moment of adjacent layers. The barrier layer could be made of insulating material including but not limited to for example oxides such as aluminum oxide ($AlO_x$) or magnesium oxide (MgO). The free layer could be made of ferromagnetic material including but not limited to for example iron, cobalt, nickel, or alloys thereof such as cobalt-iron-boron (CoFeB), in which the magnetized direction of the free layer could be altered freely depending on the influence of outside magnetic field.

Preferably, the SOT layer 38 is serving as a channel for the MRAM device as the SOT layer 38 could include metals such as tantalum (Ta), tungsten (W), platinum (Pt), or hafnium (Hf) and/or topological insulator such as bismuth selenide ($Bi_xSe_{1-x}$). The hard mask 42 preferably includes conductive or dielectric material such as tantalum (Ta), tantalum nitride (TaN), titanium (Ti), titanium nitride (TiN), platinum (Pt), copper (Cu), gold (Au), aluminum (Al), or combination thereof.

Figure 3:
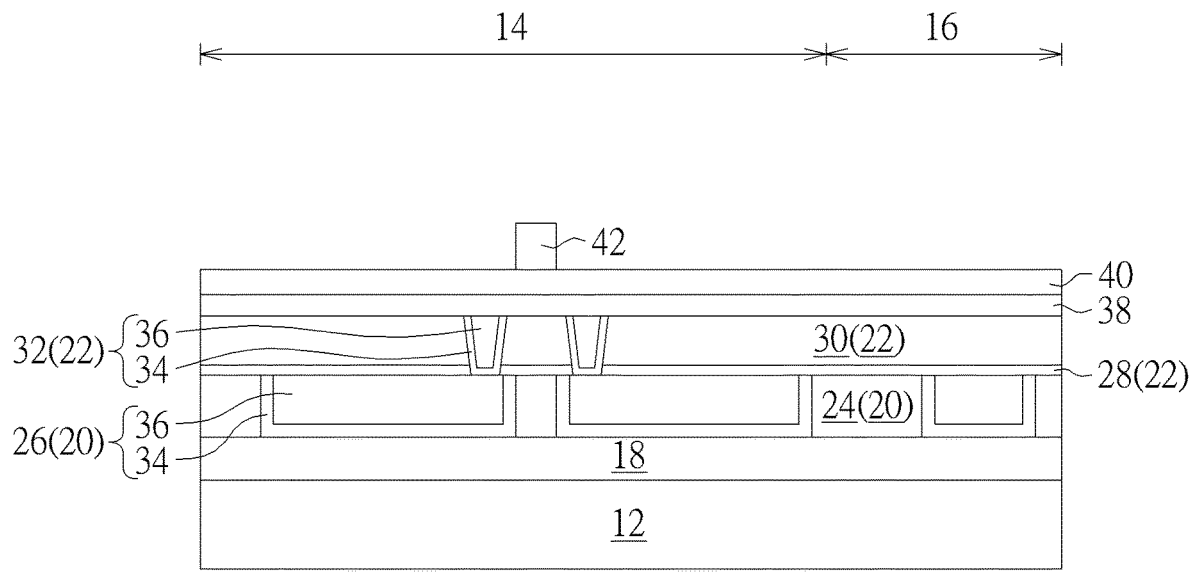

Next, as shown in FIG. 3, an etching process or more specifically a photo-etching process is conducted to pattern the hard mask 42 for exposing the surface of the MTJ stack 40 underneath. Specifically, the photo-etching process could be accomplished by first forming a patterned mask (not shown) such as patterned resist on the hard mask 42, and then an etching process is conducted by using the patterned mask to remove part of the hard mask 42 for forming a patterned hard mask 42 and exposing the surface of the MTJ stack 40. Preferably, the etching process conducted at this stage includes a reactive ion etching (RIE) process.

Figure 4:
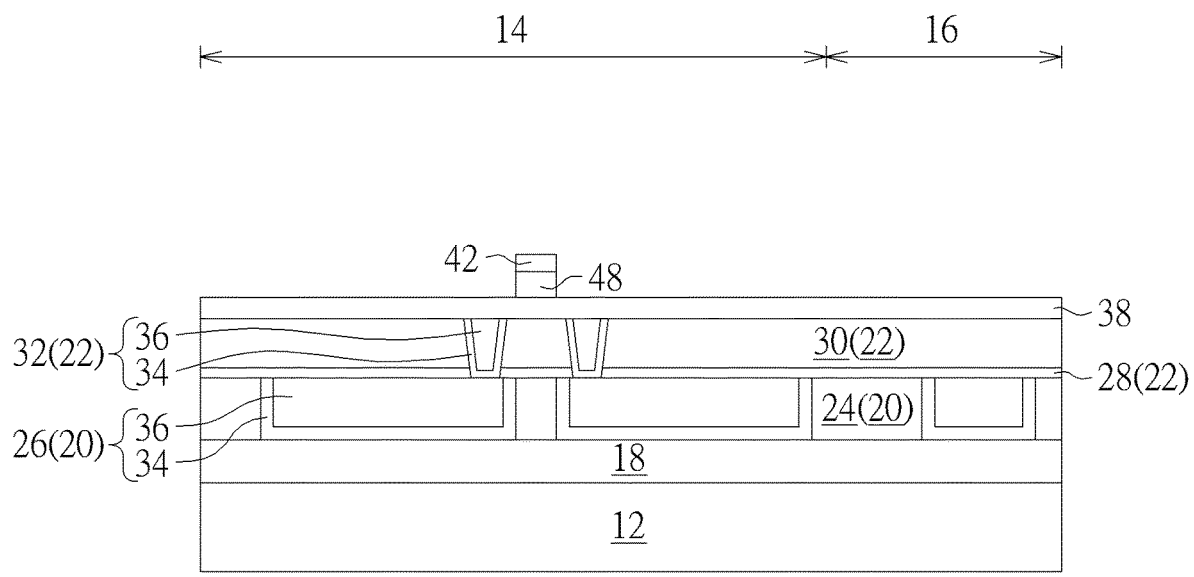

Next, as shown in FIG. 4, one or more etching process is conducted by using the patterned hard mask 42 as mask to remove part of the MTJ stack 40 for forming a MTJ 48 on the MRAM region 14, in which part of the hard mask 42 could be consumed so that the overall thickness of the hard mask 42 could be slightly reduced during the etching process.

Figure 5:
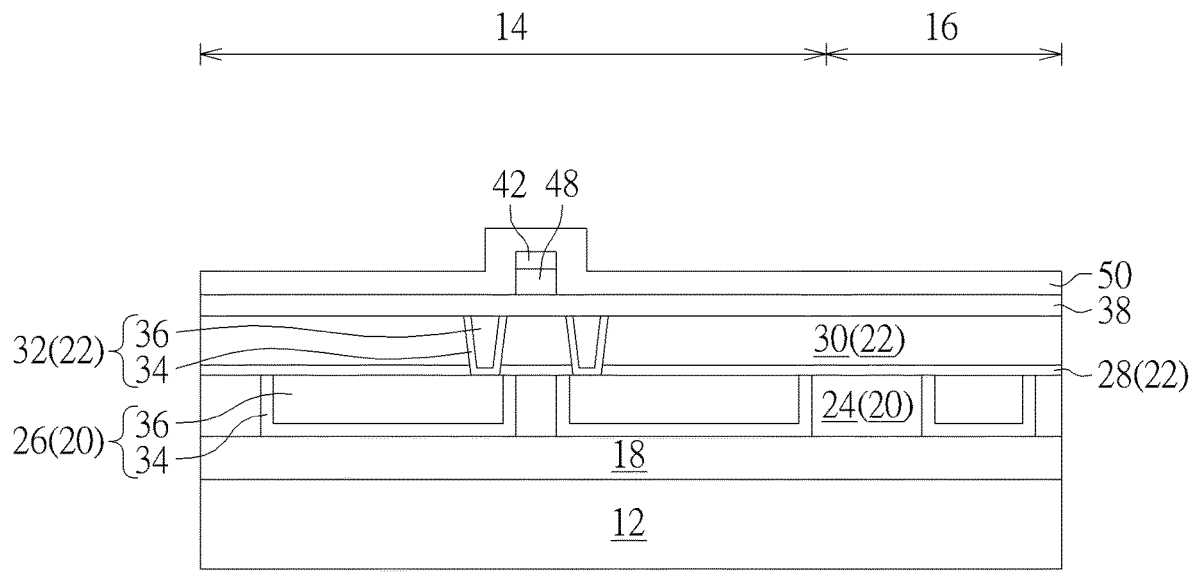

Next, as shown in FIG. 5, a cap layer 50 is formed on the MTJ 48 to cover the surface of the SOT layer 38 on the MRAM region 14 and logic region 16. In this embodiment, the cap layer 50 preferably includes silicon nitride (SiN), but could also include other dielectric material including but not limited to for example silicon oxide, silicon oxynitride (SiON), or silicon carbon nitride (SiCN).

Figure 6:
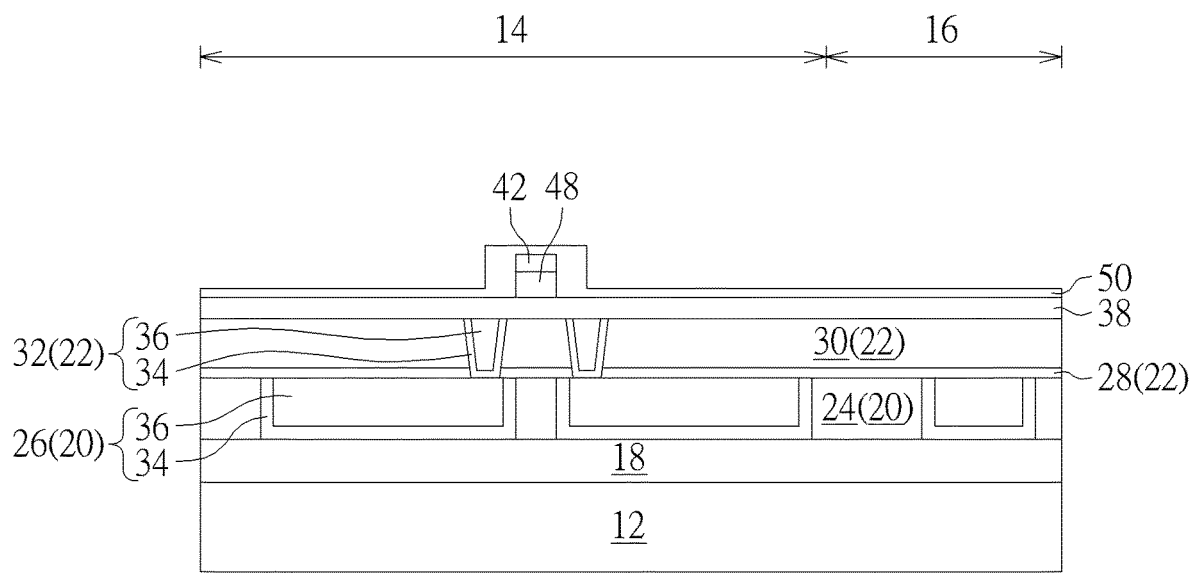

Next, as shown in FIG. 6, an etching process could be conducted without forming any patterned mask to remove part of the cap layer 50 so that the cap layer 50 directly contacting the top surface of the hard mask 42 and the cap layer 50 directly contacting the top surface of the SOT layer 38 have same thickness while the cap layer 50 directly contacting the top surface of the SOT layer 38 and the cap layer 50 directly contacting the sidewall of the MTJ 48 have different thicknesses, or more specifically the thickness the cap layer 50 directly contacting the top surface of the SOT layer 38 is less than the thickness of the cap layer 50 directly contacting the sidewall of the MTJ 48. In this embodiment, the thickness of the cap layer 50 adjacent to or directly contacting sidewall of the MTJ 48 is approximately twice or more such as three or even four times the thickness of the cap layer 50 on top or directly contacting the top surface of the SOT layer 38.

Figure 7:
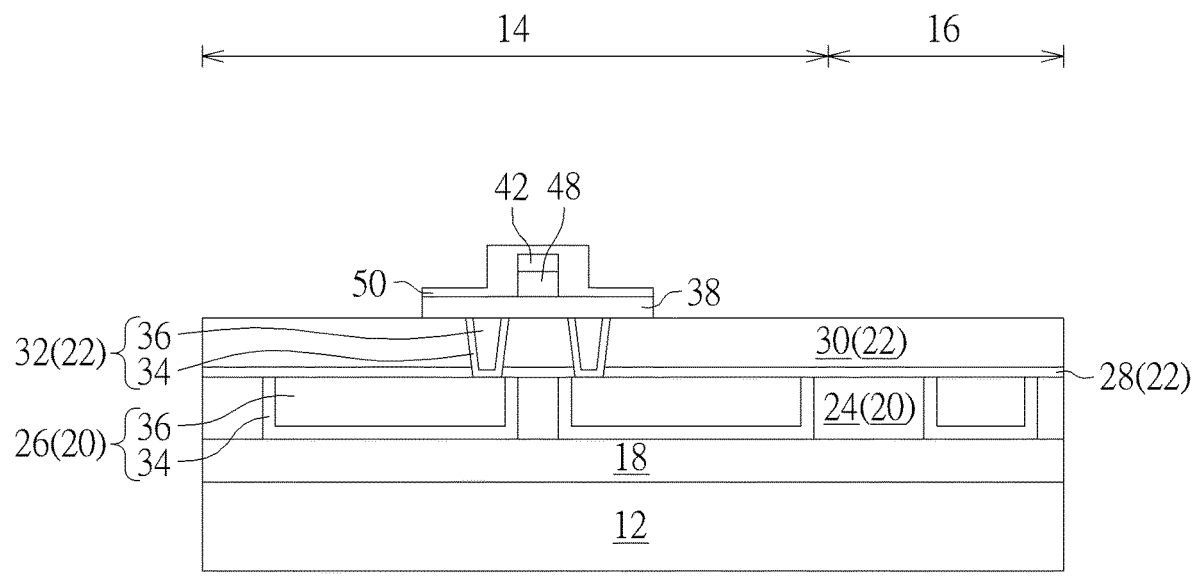

Next, as shown in FIG. 7, a photo-etching process is conducted to pattern the cap layer 50 and the SOT layer 38 by using a patterned mask (not shown) such as a patterned resist as mask to remove part of the cap layer 50 and part of the SOT layer 38 through etching process and expose the top surface of the IMD layer 30, in which the sidewall of the patterned cap layer 50 is aligned with the sidewall of the patterned SOT layer 38. It should be noted that even though none of the IMD layer 30 is removed during patterning of the cap layer 50 and the SOT layer 38, according to other embodiment of the present invention, it would also be desirable to remove part of the IMD layer 30 when part of the cap layer 50 and part of the SOT layer 38 are removed. In this instance, the sidewall of the cap layer 50 would be aligned with the sidewall of the IMD layer 30, which is also within the scope of the present invention.

Figure 8:
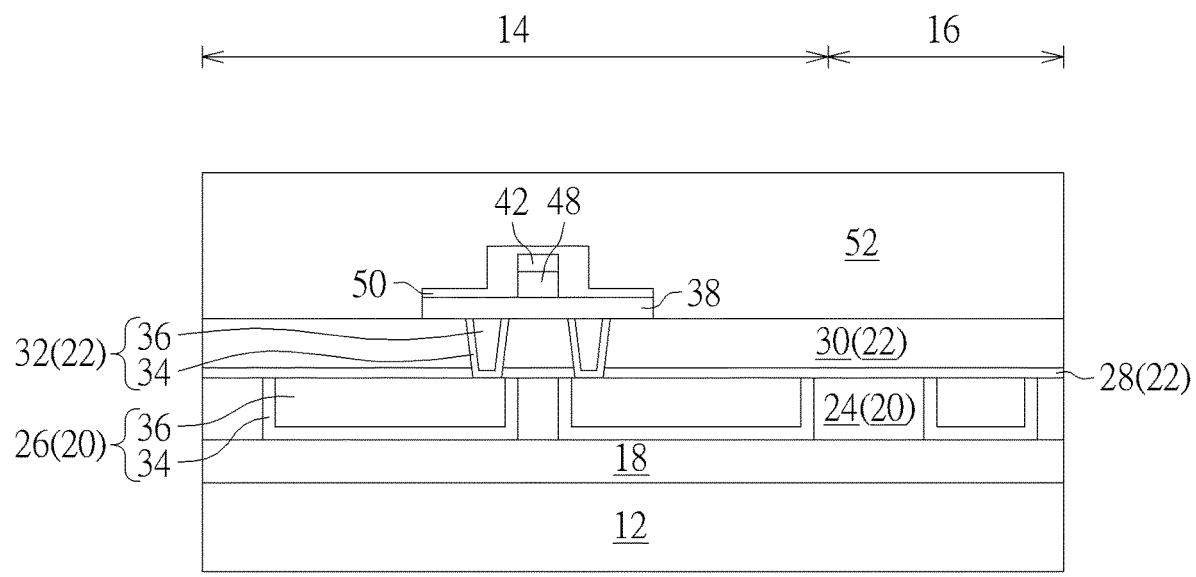

Next, as shown in FIG. 8, an atomic layer deposition (ALD) process is conducted to from an IMD layer 52 on the cap layer 50 and the IMD layer 30, in which the IMD layer 52 could include an ultra low-k (ULK) dielectric layer including but not limited to for example porous material or silicon oxycarbide (SiOC) or carbon doped silicon oxide (SiOCH).

Figure 9:
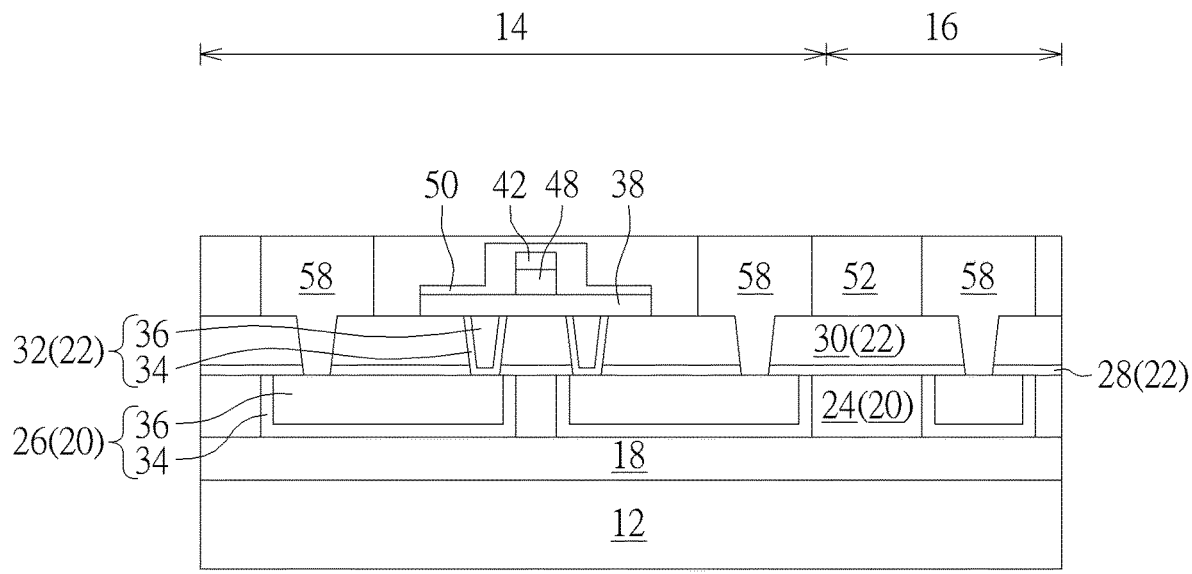

Next, as shown in FIG. 9, a planarizing process such as chemical mechanical polishing (CMP) process or etching back process is conducted to remove part of the IMD layer 52 so that the top surface of the remaining IMD layer 52 includes a planar surface and is still higher than the top surface of the cap layer 50. Next, a pattern transfer process is conducted by using a patterned mask (not shown) to remove part of the IMD layer 52, part of the IMD layer 30, and part of the stop layer 28 on the MRAM region 14 and logic region 16 to form contact holes (not shown) exposing the metal interconnections 26 underneath and conductive materials are deposited into the contact hole afterwards. For instance, a barrier layer selected from the group consisting of titanium (Ti), titanium nitride (TiN), tantalum (Ta), and tantalum nitride (TaN) and metal layer selected from the group consisting of tungsten (W), copper (Cu), aluminum (Al), titanium aluminide (TiAl), and cobalt tungsten phosphide (CoWP) could be deposited into the contact holes, and a planarizing process such as CMP could be conducted to remove part of the conductive materials including the aforementioned barrier layer and metal layer to form metal interconnections 58 in the contact holes electrically connecting the metal interconnections 26.

Figure 10:
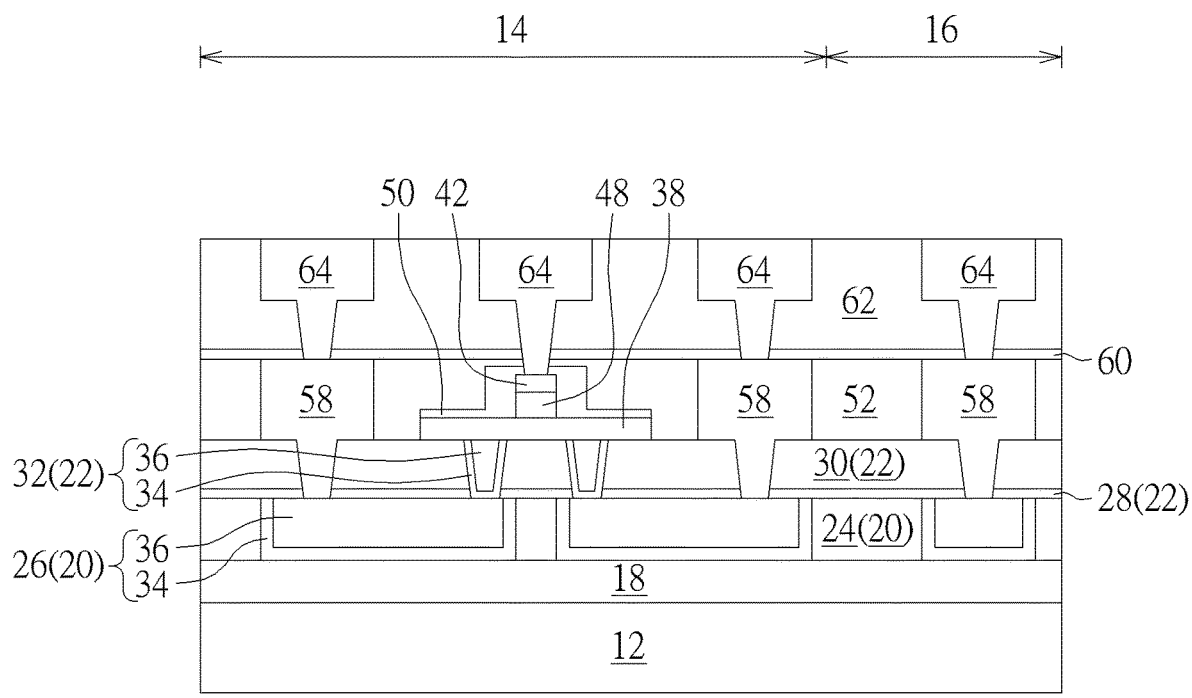

Next, as shown in FIG. 10, a stop layer 60 is formed on the MRAM region 14 and logic region 16 to cover the IMD layer 52 and metal interconnections 58, an IMD layer 62 is formed on the stop layer 60, and one or more photo-etching process is conducted to remove part of the IMD layer 62, part of the stop layer 60, and part of the IMD layer 56 on the MRAM region 14 and logic region 16 to form contact holes (not shown). Next, conductive materials are deposited into each of the contact holes and a planarizing process such as CMP is conducted to form metal interconnections 64 connecting the MTJ 48 and metal interconnections 58 underneath, in which the metal interconnections 64 on the MRAM region 14 directly contact the hard mask 42 and metal interconnections 58 underneath while the metal interconnections 64 on the logic region 16 directly contacts the metal interconnections 58 on the lower level.

In this embodiment, the stop layers 60 and 28 could be made of same or different materials, in which the two layers 60, 28 could all include nitrogen doped carbide (NDC), silicon nitride, silicon carbon nitride (SiCN), or combination thereof. Similar to the metal interconnections formed previously, each of the metal interconnections 64 could be formed in the IMD layer 62 through a single damascene or dual damascene process. For instance, each of the metal interconnections 64 could further include a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. This completes the fabrication of a semiconductor device according to an embodiment of the present invention.

Referring again to FIG. 10, FIG. 10 further illustrates a structural view of a MRAM device according to an embodiment of the present invention. As shown in FIG. 10, the MRAM device includes a substrate 12 having a MRAM region 14 and a logic region 16, an IMD layer 30 disposed on the substrate 12, at least two metal interconnections 32 disposed in the IMD layer 30 on the MRAM region 14, a SOT layer 38 disposed on a directly contacting top surface of the two metal interconnections 32, a MTJ 48 disposed on the surface of the SOT layer 38, a hard mask 42 disposed on the MTJ 48, a cap layer 50 disposed on the SOT layer 38 and the MTJ 48, an IMD layer 52 surrounding the cap layer 50 and the SOT layer 38, metal interconnections 58 disposed in the IMD layer 52 on the MRAM region 14 and the logic region 16, a stop layer 60 disposed on the IMD layer 52, an IMD layer 62 disposed on the stop layer 60, metal interconnections 64 disposed in the IMD layer 62 on the MRAM region 14 to electrically connect the MTJ 48 and the SOT layer 38 and metal interconnection in the IMD layer 62 on the logic region 16 to electrically connect the metal interconnection 58 underneath. It should be noted that even though the bottom surface of the MTJ 48 is directly contacting the SOT layer 38 in this embodiment, according to other embodiment of the present invention, it would also be desirable to form an electrode layer between the MTJ 48 and the SOT layer 38, in which the electrode layer could include conductive material such as but not limited to for example Ta, TaN, Pt, Cu, Au, Al, or combination thereof.

Viewing from a more detailed perspective, the cap layer 50 is disposed on the top surface of the hard mask 42, sidewalls of the hard mask 42, sidewalls of the MTJ 48, and top surface of the SOT layer 38, in which the top surface of the cap layer 50 is slightly lower than the top surface of the metal interconnections 58 also embedded in the IMD layer 52. Moreover, the cap layer 50 directly contacting the top surface of the hard mask 42 and the cap layer 50 directly contacting the top surface of the SOT layer 38 preferably have same thickness, and the cap layer 50 directly contacting the top surface of the SOT layer 38 and the cap layer 50 directly contacting sidewalls of the MTJ 48 and hard mask 42 preferably have different thicknesses or more specifically the thickness of the cap layer 50 on or directly contacting the top surface of the SOT layer 38 is less than the thickness of the cap layer 50 directly contacting sidewalls of the MTJ 48 and the hard mask 42. Preferably, the MTJ 48 and the hard mask 42 share same widths, the sidewall of the cap layer 50 is aligned with sidewall of the SOT layer 38, and the width of the SOT layer 38 is greater than twice the width of each of the MTJ 48 or the hard mask 42. For instance, the width of the SOT layer 38 could be three times, four times, or even five times more than the width of the MTJ 48 or the hard mask 42, which are all within the scope of the present invention.

It should also be noted that the metal interconnections 58 disposed in the IMD layers 52 adjacent to two sides of the MTJ 48 preferably include trench conductors while the metal interconnections 58 disposed in the IMD layer 30 include via conductors, in which the bottom surface of each of the trench conductors is even with the bottom surface of the SOT layer 38 and the top surface of each of the trench conductors is higher than the top surface of the cap layer 50, and the bottom surface and top surface of the via conductors within the IMD layer 30 adjacent to two sides of the SOT layer 38 are also even with bottom surface and top surface of the metal interconnection 32 directly under the SOT layer 38.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:
    forming a spin orbit torque (SOT) layer on a substrate;
    forming a magnetic tunneling junction (MTJ) on and directly contacting the SOT layer;
    forming a cap layer on and directly contacting the SOT layer and the MTJ;
    performing an etching process to remove part of the cap layer so that the cap layer directly on the SOT layer and the cap layer on sidewalls of the MTJ comprise different thicknesses; and
    patterning the cap layer and the SOT layer at the same time.

2. The method of claim 1, wherein the substrate comprises a magnetic random access memory (MRAM) region and a logic region, the method comprising:
    forming a first inter-metal dielectric (IMD) layer on the substrate;
    forming a first metal interconnection and a second metal interconnection in the first IMD layer on the MRAM region;
    forming the SOT layer on the first metal interconnection and the second metal interconnection;
    forming a MTJ stack on the SOT layer;
    forming a hard mask on the MTJ stack;
    using the hard mask to pattern the MTJ stack for forming the MTJ;
    forming the cap layer on the SOT layer and the hard mask; and
    patterning the cap layer and the SOT layer.

3. The method of claim 2, further comprising performing the etching process to remove a portion of the cap layer before patterning the cap layer and the SOT layer.

4. The method of claim 2, further comprising:
forming a second IMD layer around the cap layer; and
forming a third metal interconnection on the logic region.

5. The method of claim 4, wherein a top surface of the cap layer is lower than a top surface of the third metal interconnection.

6. The method of claim 4, further comprising:
forming a stop layer on the second IMD layer;
forming a third IMD layer on the stop layer;
forming a fourth metal interconnection on the MRAM region to connect to the SOT layer; and
forming a fifth metal interconnection on the logic region to connect to the third metal interconnection.

7. The method of claim 2, wherein a first portion of the cap layer on the first IMD layer and a second portion of the cap layer adjacent to the MTJ comprise different thicknesses.

8. The method of claim 2, wherein a thickness of the first portion of the cap layer on the first IMD layer is less than a thickness of the second portion of the cap layer adjacent to the MTJ.

9. The method of claim 1, wherein a sidewall of the cap layer is aligned with a sidewall of the SOT layer.

10. A semiconductor device, comprising:
a spin orbit torque (SOT) layer on a substrate;
a magnetic tunneling junction (MTJ) on the SOT layer;
a hard mask on the MTJ; and
a cap layer on and directly contacting the SOT layer and the hard mask, wherein the cap layer directly on the SOT layer and the cap layer on sidewalls of the MTJ comprise different thicknesses.

11. The semiconductor device of claim 10, wherein the substrate comprises a magnetic random access memory (MRAM) region and a logic region, the semiconductor device comprising:
a first inter-metal dielectric (IMD) layer on the substrate;
a first metal interconnection and a second metal interconnection in the first IMD layer on the MRAM region;
the SOT layer on the first metal interconnection and the second metal interconnection;
the MTJ on the SOT layer;
the hard mask on the MTJ;
a second IMD layer around the MTJ; and
a third metal interconnection in the second IMD layer on the logic region.

12. The semiconductor device of claim 11, further comprising:
a stop layer on the second IMD layer;
a third IMD layer on the stop layer;
a fourth metal interconnection on the MRAM region to connect to the SOT layer; and
a fifth metal interconnection on the logic region to connect to the third metal interconnection.

13. The semiconductor device of claim 11, wherein a top surface of the cap layer is lower than a top surface of the third metal interconnection.

14. The semiconductor device of claim 11, wherein a first portion of the cap layer on the first IMD layer and a second portion of the cap layer adjacent to the MTJ comprise different thicknesses.

15. The semiconductor device of claim 11, wherein a thickness of the first portion of the cap layer on the first IMD layer is less than a thickness of the second portion of the cap layer adjacent to the MTJ.

16. The semiconductor device of claim 10, wherein a sidewall of the cap layer is aligned with a sidewall of the SOT layer.

* * * * *